(12) United States Patent
Chen et al.

(10) Patent No.: US 10,993,350 B2
(45) Date of Patent: Apr. 27, 2021

(54) SLIDE RAIL MECHANISM AND SUPPORTING ASSEMBLY THEREOF

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 1 day.

(21) Appl. No.: 16/424,537

(22) Filed: May 29, 2019

(65) Prior Publication Data

US 2020/0275577 A1 Aug. 27, 2020

(30) Foreign Application Priority Data

Feb. 25, 2019 (TW) .................................. 108106609

(51) Int. Cl.
*H05K 7/00* (2006.01)
*H05K 7/18* (2006.01)
*A47B 88/49* (2017.01)
*A47B 88/407* (2017.01)

(52) U.S. Cl.
CPC ........... *H05K 7/183* (2013.01); *A47B 88/407* (2017.01); *A47B 88/49* (2017.01)

(58) Field of Classification Search
CPC .... H07K 7/183; H07K 7/1491; H07K 7/1489; H07K 7/1418; H07K 7/1421; H07K 7/14; H02B 1/01; H01R 9/2416; A47K 3/281; A47K 5/02; A47K 2201/025; H05K 7/183; H05K 7/1491; H05K 7/1489; H05K 7/1418; H05K 7/1421; H05K 7/14; A47B 88/49; A47B 88/407; A47B 88/40; A47B 88/423
USPC ..... 312/334.1, 334.4, 334.5, 223.6; 361/826, 361/727, 756; 248/68.1, 205.3, 307, 248/220.1, 223.41
See application file for complete search history.

(56) References Cited

U.S. PATENT DOCUMENTS

| 6,474,758 | B1 * | 11/2002 | Hedrick | ................. G07F 17/32 312/223.1 |
|---|---|---|---|---|
| 7,472,795 | B2 | 1/2009 | Dubon et al. | |
| 7,554,819 | B2 | 6/2009 | Chen et al. | |

(Continued)

FOREIGN PATENT DOCUMENTS

| EP | 2870897 A1 | 5/2015 |
|---|---|---|
| EP | 3030065 * | 6/2016 |

(Continued)

*Primary Examiner* — Janet M Wilkens
(74) *Attorney, Agent, or Firm* — Alan D. Kamrath; Karin L. Williams; Mayer & Williams PC

(57) ABSTRACT

A slide rail mechanism includes a slide rail assembly and a supporting assembly. The slide rail assembly includes a first rail, a second rail and a third rail movably mounted between the first rail and the second rail. The second rail is movable relative to the first rail. The second rail is arranged with a mounting device. The supporting assembly includes a supporting member and a connecting device arranged on the supporting member. The connecting device is configured to be connected to the mounting device.

12 Claims, 11 Drawing Sheets

(56) References Cited

U.S. PATENT DOCUMENTS

| | | | | |
|---|---|---|---|---|
| 7,687,716 | B2* | 3/2010 | Pepe | H04Q 1/068 |
| | | | | 174/101 |
| 7,712,615 | B2 | 5/2010 | Chen et al. | |
| 7,746,667 | B1* | 6/2010 | Baiza | H05K 7/1491 |
| | | | | 361/825 |
| 8,251,321 | B2* | 8/2012 | Chen | H05K 7/1491 |
| | | | | 248/70 |
| 8,872,030 | B2* | 10/2014 | McNeal | H04Q 1/02 |
| | | | | 174/101 |
| 9,867,311 | B2* | 1/2018 | Chen | F16L 3/015 |
| 2006/0113433 | A1* | 6/2006 | Chen | H05K 7/1491 |
| | | | | 248/70 |
| 2011/0290955 | A1* | 12/2011 | Yu | H05K 7/1491 |
| | | | | 248/70 |
| 2016/0186895 | A1* | 6/2016 | Chen | H02B 1/012 |
| | | | | 248/68.1 |
| 2018/0049341 | A1* | 2/2018 | Chen | H02G 3/32 |
| 2020/0037462 | A1* | 1/2020 | Chen | H02G 3/0456 |
| 2020/0275576 | A1* | 8/2020 | Chen | A47B 88/49 |

FOREIGN PATENT DOCUMENTS

| | | | |
|---|---|---|---|
| JP | 3188395 | U | 1/2014 |
| JP | 3196217 | U | 2/2015 |

\* cited by examiner

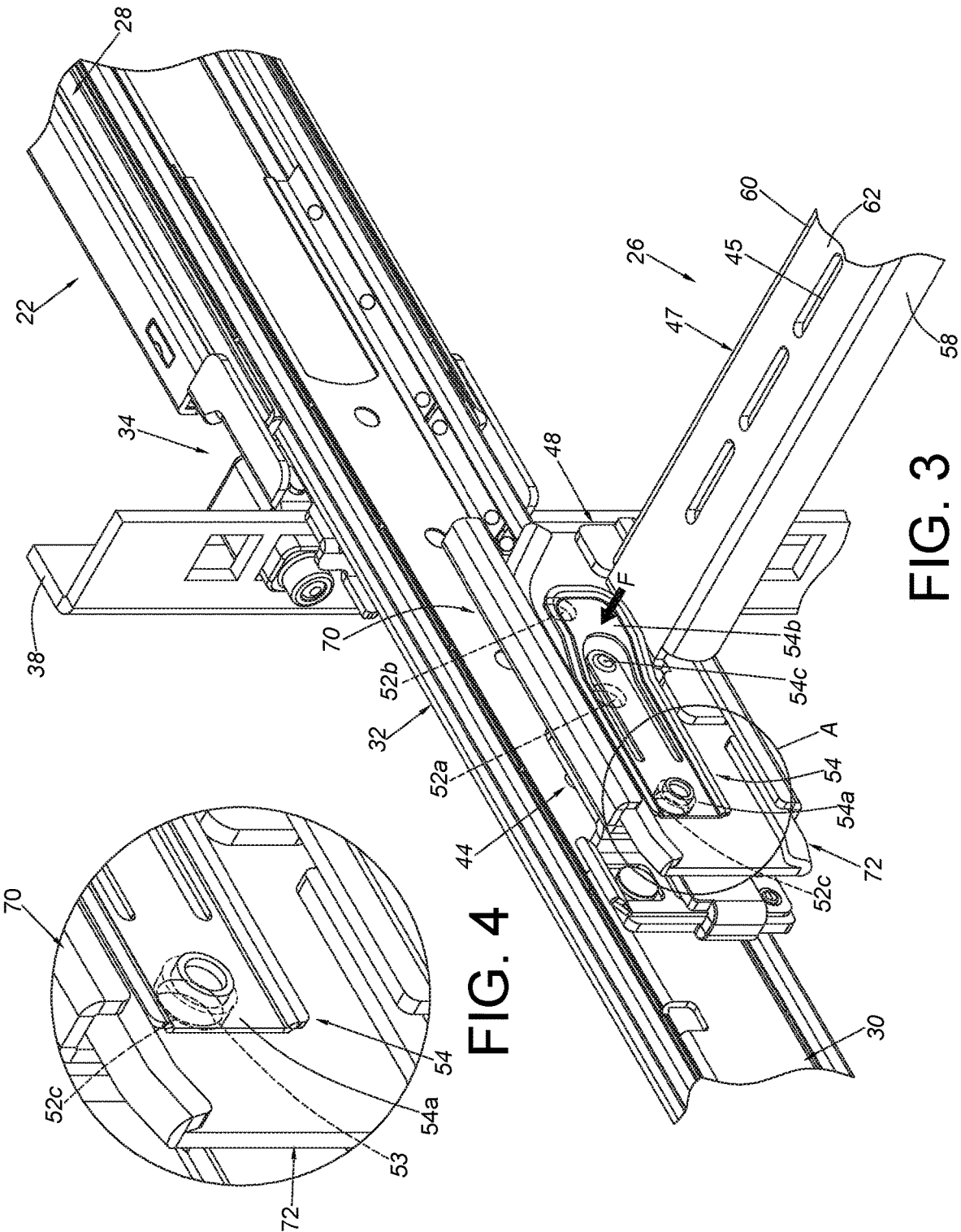

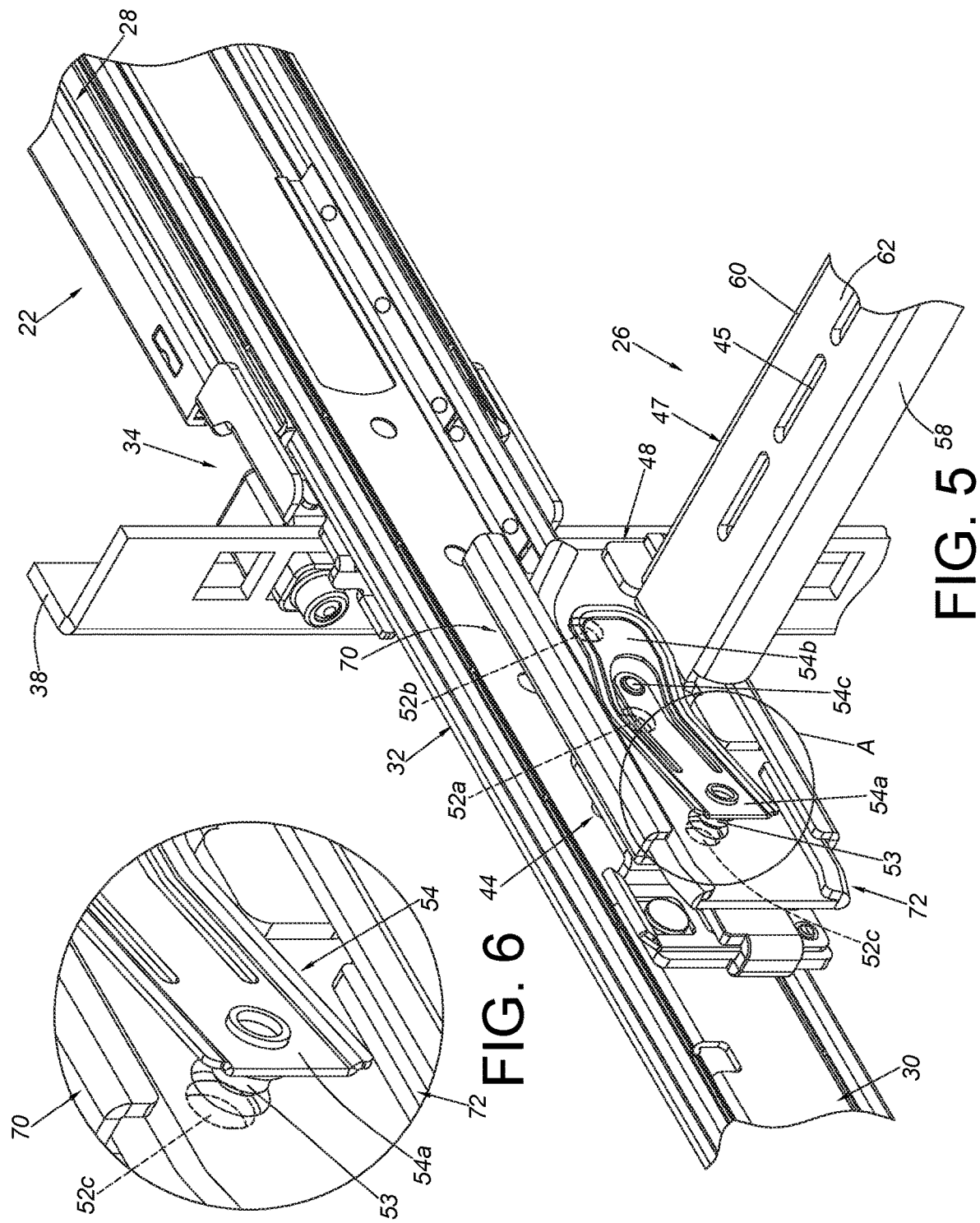

SLIDE RAIL MECHANISM AND SUPPORTING ASSEMBLY THEREOF

BACKGROUND OF THE INVENTION

1. Field of the Invention

The present invention relates to a slide rail mechanism, and more particularly, to a slide rail mechanism and a supporting assembly thereof.

2. Description of the Prior Art

Generally, in a rack system, a pair of slide rail assemblies mounted to a rack is usually configured to carry a carried object. The carried object can be an electronic device. Therefore, the rack system is also arranged with a cable management mechanism for supporting cables behind the electronic device.

U.S. Pat. No. 7,554,819 B2 discloses a pair of three-section slide rail assemblies. One of the slide rail assemblies is arranged with a cable management mechanism. The cable management mechanism has two cable management arms pivoted relative to each other. One of the cable management arms has one end connected to an outer rail (such as a fixed rail), and the other one of the cable management arms has one end connected to a movable rail (such as an inner rail). Furthermore, a support rail is configured to support a bottom part of the cable management mechanism. One of two ends of the support rail is connected to a middle rail of the slide rail assembly, such that the support rail can be moved along with the middle rail. (Please refer to FIG. 14 and FIG. 15. of the aforementioned prior art.)

U.S. Pat. No. 7,712,615 B2 discloses a pair of three-section slide rail assemblies. One of the slide rail assemblies is arranged with a cable management mechanism. The cable management mechanism has two cable management arms pivoted relative to each other. One of the cable management arms has one end connected to an outer rail (such as a fixed rail), and the other one of the cable management arms has one end connected to a movable rail (such as an inner rail). Furthermore, a support rail is configured to support a bottom part of the cable management mechanism. Two ends of the support rail are respectively movably mounted to passages of the outer rails (such as the fixed rails) of the pair of slide rail assemblies. When the two cable management arms are driven to expand in response to movement of a second rail (a middle rail), the support rail is driven to move accordingly. (Please refer to FIG. 3 of the aforementioned prior art.)

U.S. Pat. No. 7,472,795 B2 discloses a pair of slide rail assemblies. One of the slide rail assemblies is arranged with a cable management mechanism. The cable management mechanism has two cable management arms pivoted relative to each other. One of the cable management arms has one end connected to an outer rail (such as a fixed rail), and the other one of the cable management arms has one end connected to a movable rail (such as an inner rail). Furthermore, a support rail is configured to support a bottom part of the cable management mechanism. Two ends of the support rail are respectively movably mounted to passages of the outer rails (such as the fixed rails). (Please refer to FIG. 4 and FIG. 5 of the aforementioned prior art.)

In the three aforementioned prior arts, the support rail is not connected to the inner rail of the three-section slide rail assembly; or connecting mechanism between the support rail and the slide rail assembly may not meet a specific requirement of the market. Therefore, it is important to develop a different product.

SUMMARY OF THE INVENTION

The present invention provides a slide rail mechanism and a supporting assembly thereof.

According to an embodiment of the present invention, a slide rail mechanism comprises a first slide rail assembly and a supporting assembly. The first slide rail assembly comprises a first rail, a second rail and a third rail movably mounted between the first rail and the second rail. The second rail is longitudinally movable relative to the first rail. Wherein, the second rail of the first slide rail assembly is arranged with a first mounting device. The supporting assembly comprises a supporting member and a first connecting device arranged on the supporting member, wherein the first connecting device is configured to be connected to the first mounting device.

Preferably, the slide rail mechanism further comprises a second slide rail assembly. The second slide rail assembly comprises a first rail, a second rail and a third rail movably mounted between the first rail and the second rail of the second slide rail assembly. The second rail of the second slide rail assembly is arranged with a second mounting device. The supporting member is further arranged with a second connecting device. Wherein, the first connecting device and the second connecting device are configured to be detachably connected to the first mounting device and the second mounting device respectively.

Preferably, the supporting member is substantially transversally arranged relative to a longitudinal direction of each of the first and second slide rail assemblies, and the first connecting device and the second connecting device are respectively arranged adjacent to end parts of two portions of the supporting member.

Preferably, one of the first mounting device and the first connecting device comprises at least one engaging feature, and the other one of the first mounting device and the first connecting device comprises an engaging member configured to be engaged with the at least one engaging feature.

Preferably, the at least one engaging feature comprises a first engaging feature, a second engaging feature and a third engaging feature. The engaging member comprises an engaging part configured to be selectively engaged with one of the first engaging feature, the second engaging feature and the third engaging feature.

Preferably, the first engaging feature, the second engaging feature and the third engaging feature are spaced from each other along a longitudinal direction of each of the first and second slide rail assemblies.

Preferably, the supporting member has a front part, a rear part and a middle part located between the front part and the rear part. The front part and the rear part are substantially perpendicularly connected to the middle part.

Preferably, the slide rail mechanism further comprises a connecting base. The engaging member further comprises an operating part and a connecting part. The connecting part is located between the operating part and the engaging part. The connecting part is connected to the connecting base.

Preferably, the connecting part is fixedly connected to the connecting base. The operating part is extended from the engaging part. The operating part is tilted relative to the engaging part with the connecting part working as a supporting point. When the operating part is pressed, the engaging part is configured to be disengaged from one of the first engaging feature, the second engaging feature and the third engaging feature.

Preferably, the connecting base has a hole. The engaging part of the engaging member is located at a position corresponding to the hole.

Preferably, the slide rail mechanism further comprises a mounting base. The mounting base comprises the at least one engaging feature. The connecting base is movably mounted to the mounting base through a guiding passage.

Preferably, one of the mounting base and the connecting base comprises a first bending wall, a second bending wall and a side wall connected between the first bending wall and the second bending wall. The guiding passage is defined by the first bending wall, the second bending wall and the side wall.

According to another embodiment of the present invention, a supporting assembly is applicable to a first mounting device and a second mounting device. The supporting assembly comprises a supporting member, a first connecting device and a second connecting device. The supporting member has a first portion and a second portion opposite to each other. The first connecting device is arranged adjacent to the first portion and configured to be engaged with the first mounting device. The second connecting device is arranged adjacent to the second portion and configured to be engaged with the second mounting device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a partial view showing the slide rail assembly and the supporting assembly being connected to each other through a mounting device and a connecting device according to an embodiment of the present invention;

FIG. 4 is an enlarged view of an area A of FIG. 3;

FIG. 5 is a partial view showing the slide rail assembly and the supporting assembly being disengaged from each other through the mounting device and the connecting device according to an embodiment of the present invention;

FIG. 6 is an enlarged view of an area A of FIG. 5;

DETAILED DESCRIPTION

Figure 1:
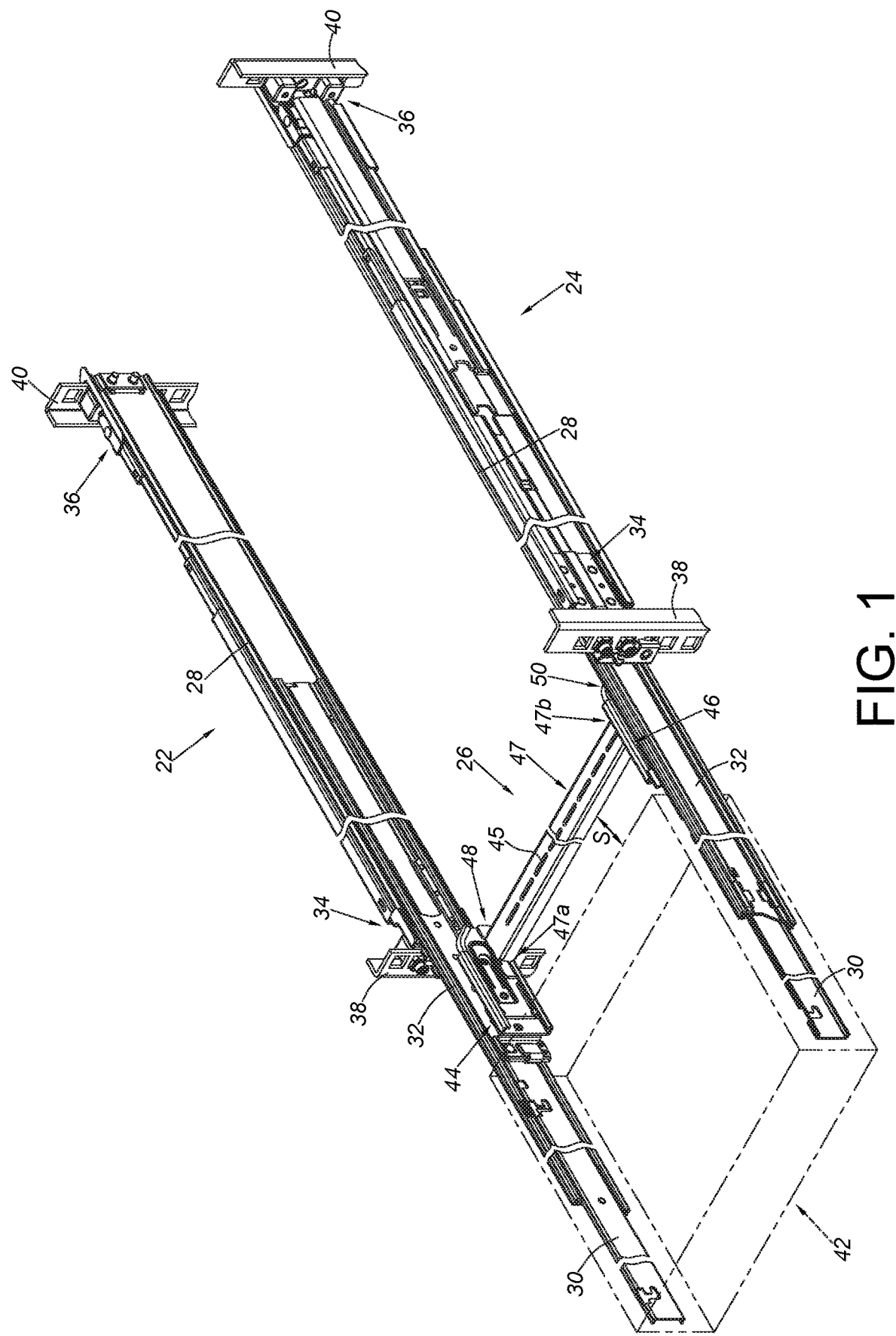
FIG. 1 is a diagram showing a slide rail mechanism configured to mount a carried object to a rack according to an embodiment of the present invention.

As shown in FIG. 1, a slide rail mechanism comprises a first slide rail assembly 22 and a supporting assembly 26 according to an embodiment of the present invention. Preferably, the slide rail mechanism further comprises a second slide rail assembly 24. Each of the first slide rail assembly 22 and the second slide rail assembly 24 comprises a first rail 28 and a second rail 30. Preferably, each of the first slide rail assembly 22 and the second slide rail assembly 24 further comprises a third rail 32 movably mounted between the first rail 28 and the second rail 30 for extending a traveling distance of the second rail 30 relative to the first rail 28. In the present embodiment, the first rail 28 is an outer rail (fixed rail), the second rail 30 is an inner rail, and the third rail 32 is a middle rail. A front part and a rear part of the first rail 28 are respectively mounted to a first post 38 and a second post 40 of a rack through a first bracket device 34 and a second bracket device 36. On the other hand, the second rail 30 is longitudinally movable relative to the first rail 28 through the third rail 32, and the second rail 30 is configured to mount a carried object 42. The carried object 42 can be an electronic apparatus or a chassis. Through moving the second rail 30 relative to the first rail 28 from a retracted state to an extended state, the carried object 42 can be pulled out of the rack.

The second rail 30 of the first slide rail assembly 22 and the second rail 30 of the second slide rail assembly 24 are respectively arranged with a first mounting device 44 and a second mounting device 46. Preferably, structural configuration of the first mounting device 44 is substantially identical (or symmetric) to structural configuration of the second mounting device 46.

The supporting assembly 26 comprises a supporting member 47, and a first connecting device 48 and a second connecting device 50 arranged on the supporting member 47. The first connecting device 48 and the second connecting device 50 are respectively connected (such as detachably connected) to the first mounting device 44 and the second mounting device 46. Preferably, the first mounting device 44 and the second mounting device 46 are respectively arranged adjacent to a rear end part of the second rail 30 of the first slide rail assembly 22 and a rear end part of the second rail 30 of the second slide rail assembly 24. Therefore, when the supporting member 47 is connected to the first mounting device 44 and the second mounting device 46 through the first connecting device 48 and the second connecting device 50, the supporting member 47 is located behind the carried object 42, and the supporting member 47 is separated from the carried object 42 by a predetermined distance S. For example, the supporting member 47 is configured to support cables behind the carried object 42. Preferably, the supporting member 47 has at least one cable management feature 45 configured to manage the cables. In the present embodiment, the at least one cable management feature 45 can be a plurality of elongated holes. When the supporting member 47 supports the cables behind the carried object 42, a string or a strap (not shown in figures) can be used to pass through the at least one cable management feature 45 to bind or fix the cables; or an additional accommodating box (not shown in figures) can be used to engage with the at least one cable management feature 45 to accommodate or manage the cables. Preferably, structural configuration of the first connecting device 48 is substantially identical (or symmetric) to structural configuration of the second connecting device 50. Preferably, the supporting member 47 is substantially transversally arranged relative to a longitudinal direction of each of the first slide rail assembly 22 and the second slide rail assembly 24. The first connecting device 48 and the second connecting device 50 are respectively arranged adjacent to two opposite portions of the supporting member 47, such as a first portion 47a and a second portion 47b. Specifically, the first connecting device 48 is arranged adjacent to an end part of the first portion 47a of the supporting member 47, and the second connecting device 50 is arranged adjacent to an end part of the second portion 47b of the supporting member 47.

Figure 2:
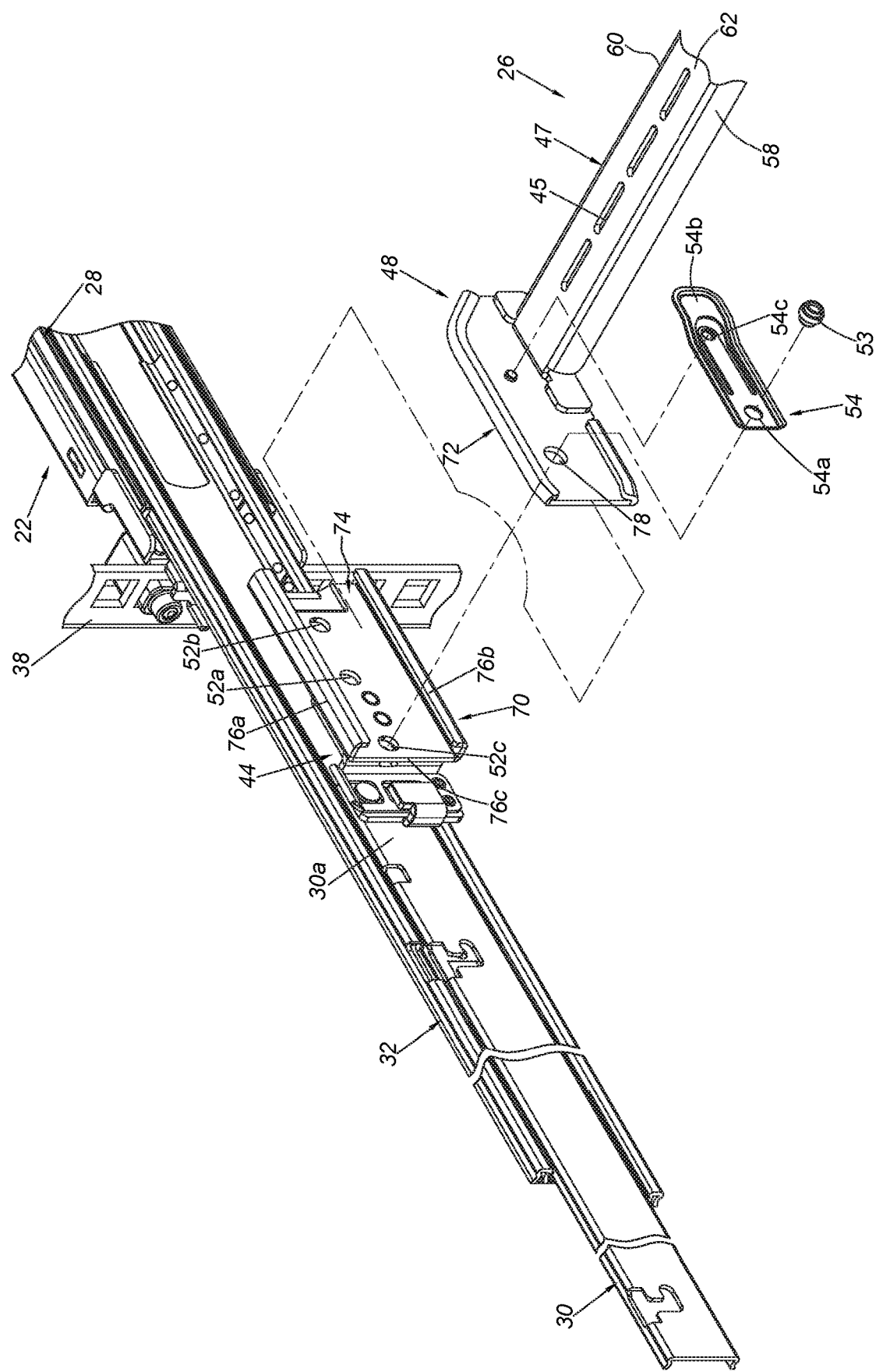
FIG. 2 is a partial exploded view of a slide rail assembly and a supporting assembly according to an embodiment of the present invention.

As shown in FIG. 2 and FIG. 3, the second rail 30 is in the extended state relative to the first rail 28. The first mounting device 44 is arranged adjacent to an end part (such as a rear end part 30a) of the second rail 30 of the first slide rail assembly 22. On the other hand, the supporting member 47 has a front part 58, a rear part 60 and a middle part 62 located between the front part 58 and the rear part 60. The front part 58 and the rear part 60 are substantially perpendicularly connected to the middle part 62. Preferably, the at least one cable management feature 45 is arranged on the middle part 62.

One of the first mounting device 44 and the first connecting device 48 comprises at least one engaging feature. In the present embodiment, the first mounting device 44 comprises a first engaging feature 52a, a second engaging feature 52b and a third engaging feature 52c, but the present invention is not limited thereto. Preferably, the first engaging feature 52a, the second engaging feature 52b and the third engaging feature 52c are spaced from each other along the longitudinal direction of each of the first slide rail assembly 22 and the second slide rail assembly 24. In the present embodiment, the engaging features 52a, 52b, 52c are engaging holes. On the other hand, the other one of the first mounting device 44 and the first connecting device 48 comprises an engaging member 54. In the present embodiment, the first connecting device 48 comprises the engaging member 54. The engaging member 54 comprises an engaging part 54a configured to be selectively engaged with one of the first engaging feature 52a, the second engaging feature 52b and the third engaging feature 52c. The engaging part 54a can be engaged with one of the first engaging feature 52a, the second engaging feature 52b and the third engaging feature 52c through a positioning member 53 or a protrusion (such as a hook) of the engaging part 54a.

Preferably, the supporting assembly 26 further comprises a mounting base 70 and a connecting base 72. The mounting base 70 comprises the at least one engaging feature (such as the engaging features 52a, 52b, 52c). The connecting base 72 is movably mounted to the mounting base 70 through a guiding passage 74. For example, one of the mounting base 70 and the connecting base 72 comprises a first bending wall 76a, a second bending wall 76b and a side wall 76c connected between the first bending wall 76a and the second bending wall 76b. In the present embodiment, the mounting base 70 comprises the first bending wall 76a, the second bending wall 76b and the side wall 76c. The guiding passage 74 is defined by the first bending wall 76a, the second bending wall 76b and the side wall 76c for accommodating the connecting base 72. The side wall 76c of the mounting base 70 is arranged with the at least one engaging feature (such as the first engaging feature 52a, the second engaging feature 52b and the third engaging feature 52c).

On the other hand, the connecting base 72 has a hole 78. The engaging member 54 is attached to the connecting base 72, and the engaging part 54a of the engaging member 54 (or the positioning member 53) is located at a position corresponding to the hole 78 to be engaged with the at least one engaging feature of the mounting base 70, such as the first engaging feature 52a, the second engaging feature 52b or the third engaging feature 52c (please refer to FIG. 4, the engaging part 54a of the engaging member 54 is configured to be engaged with the third engaging feature 52c of the mounting base 70 through the positioning member 53 or the protrusion).

Preferably, the engaging member 54 is an elastic piece, and the engaging member 54 further comprises an operating part 54b and a connecting part 54c. The connecting part 54c is located between the operating part 54b and the engaging part 54a. The connecting part 54c is connected (such as fixedly connected) to the connecting base 72. On the other hand, the operating part 54b is extended from the engaging part 54a, and the operating part 54b is tilted relative to the engaging part 54a with the connecting part 54c working as a supporting point (a fixed point).

As shown in FIG. 3 to FIG. 6, when a user applies a force F (as shown in FIG. 3 and FIG. 4) to the operating part 54b of the engaging member 54, the engaging part 54a is tilted relative to the operating part 54b to generate an elastic force (as shown in FIG. 5 and FIG. 6), and the positioning member 53 or the protrusion of the engaging part 54a is disengaged from the at least one engaging feature, such as the first engaging feature 52a, the second engaging feature 52b or the third engaging feature 52c (please refer to FIG. 5 and FIG. 6, the positioning member 53 of the engaging part 54a of the engaging member 54 is disengaged from the third engaging feature 52c of the mounting base 70). On the other hand, when the force F no longer exists, the elastic force is released to drive the operating part 54b to return to an initial state (i.e. a state shown in FIG. 3).

Figure 7:
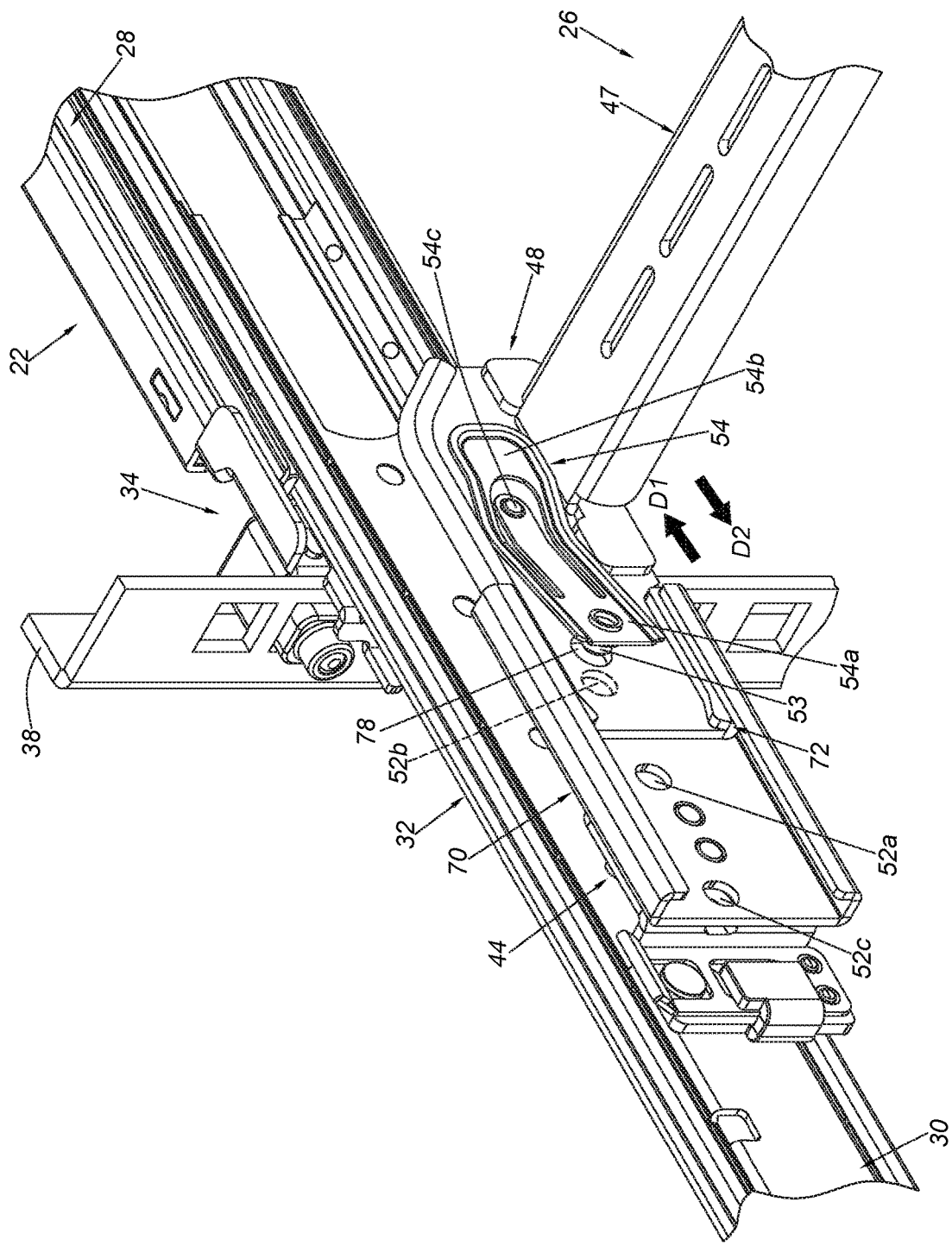
FIG. 7 is a partial view showing the supporting assembly adjustable relative to the mounting device along two directions when the slide rail assembly and the supporting assembly are disengaged from each other through the connecting device and the mounting device according to an embodiment of the present invention.

As shown in FIG. 7, when the engaging part 54a of the engaging member 54 of the first connecting device 48 (and the second connecting device 50) of the supporting assembly 26 is disengaged from the at least one engaging feature (such as the first engaging feature 52a, the second engaging feature 52b or the third engaging feature 52c) of the first mounting device 44 (and the second mounting device 46), the supporting assembly 26 is longitudinally movable relative to the first mounting device 44 (and the second mounting device 46) along a first direction D1 or a second direction D2; or the supporting assembly 26 can be detached from the first mounting device 44 (and the second mounting device 46) along the first direction D1. The second direction D2 is opposite to the first direction D1.

Figure 8:
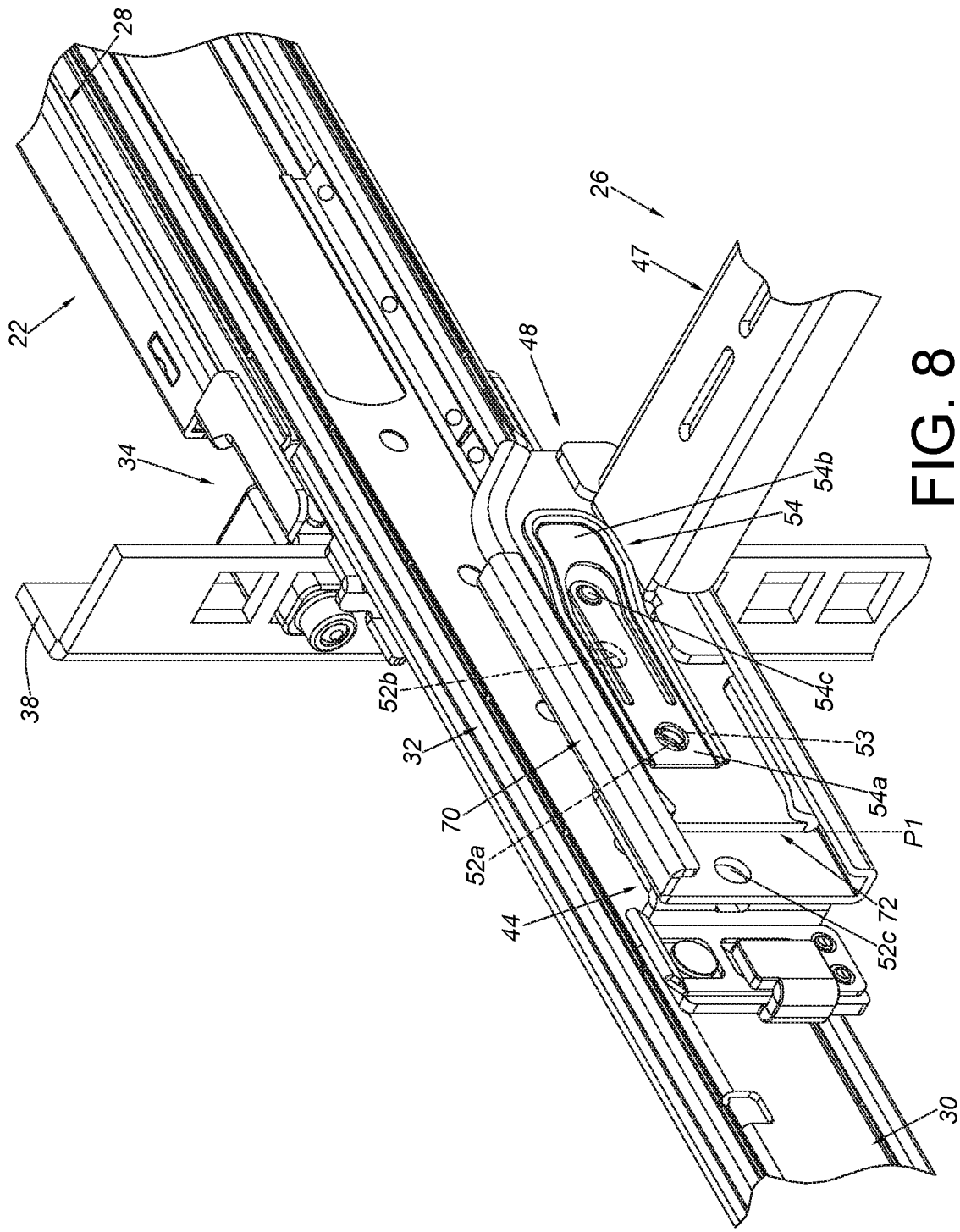
FIG. 8 is a partial view showing the supporting assembly configured to be located at a first connecting position relative to the slide rail assembly through the connecting device being engaged with the mounting device according to an embodiment of the present invention.
Figure 9:
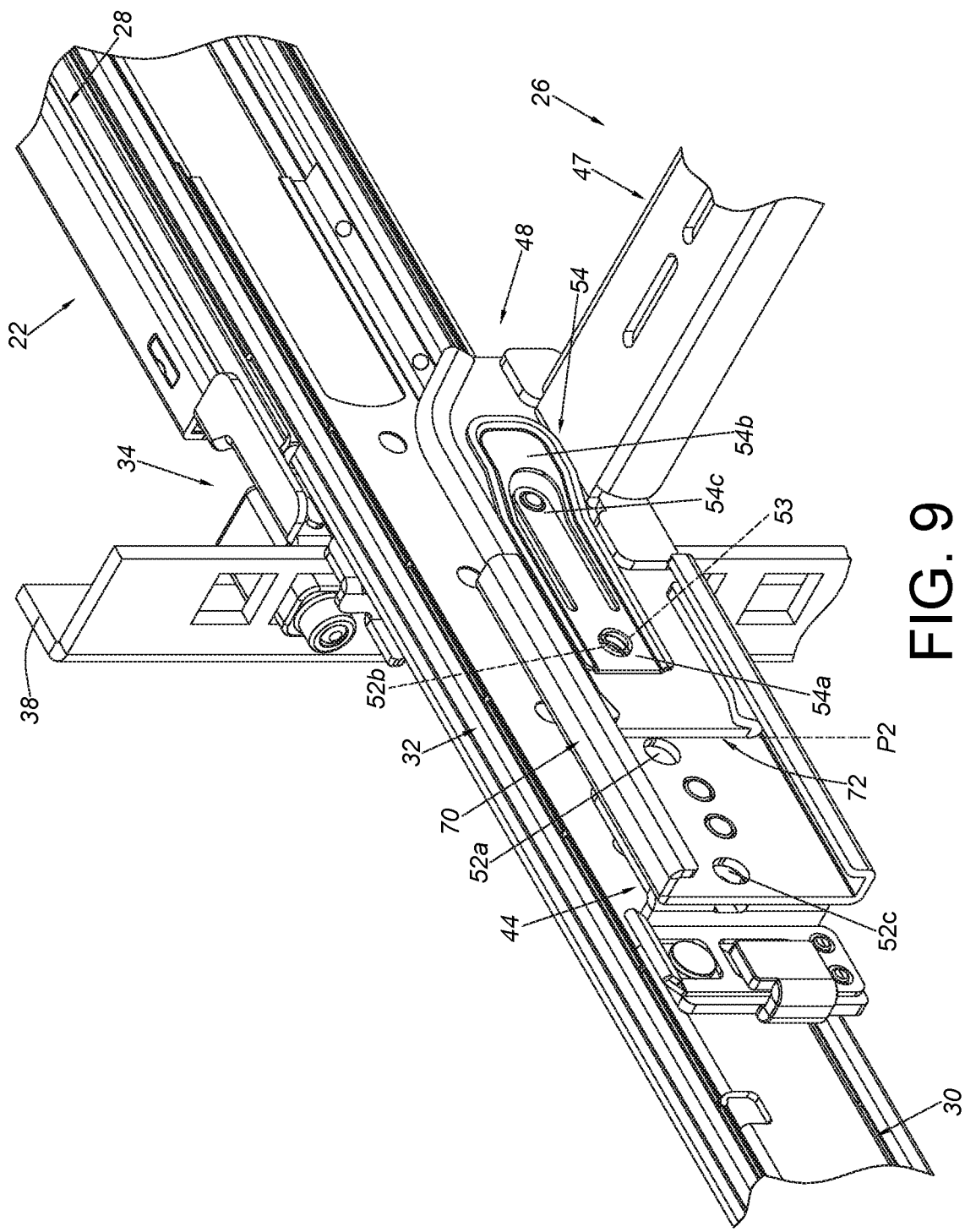
FIG. 9 is a partial view showing the supporting assembly configured to be located at a second connecting position relative to the slide rail assembly through the connecting device being engaged with the mounting device according to an embodiment of the present invention.
Figure 10:
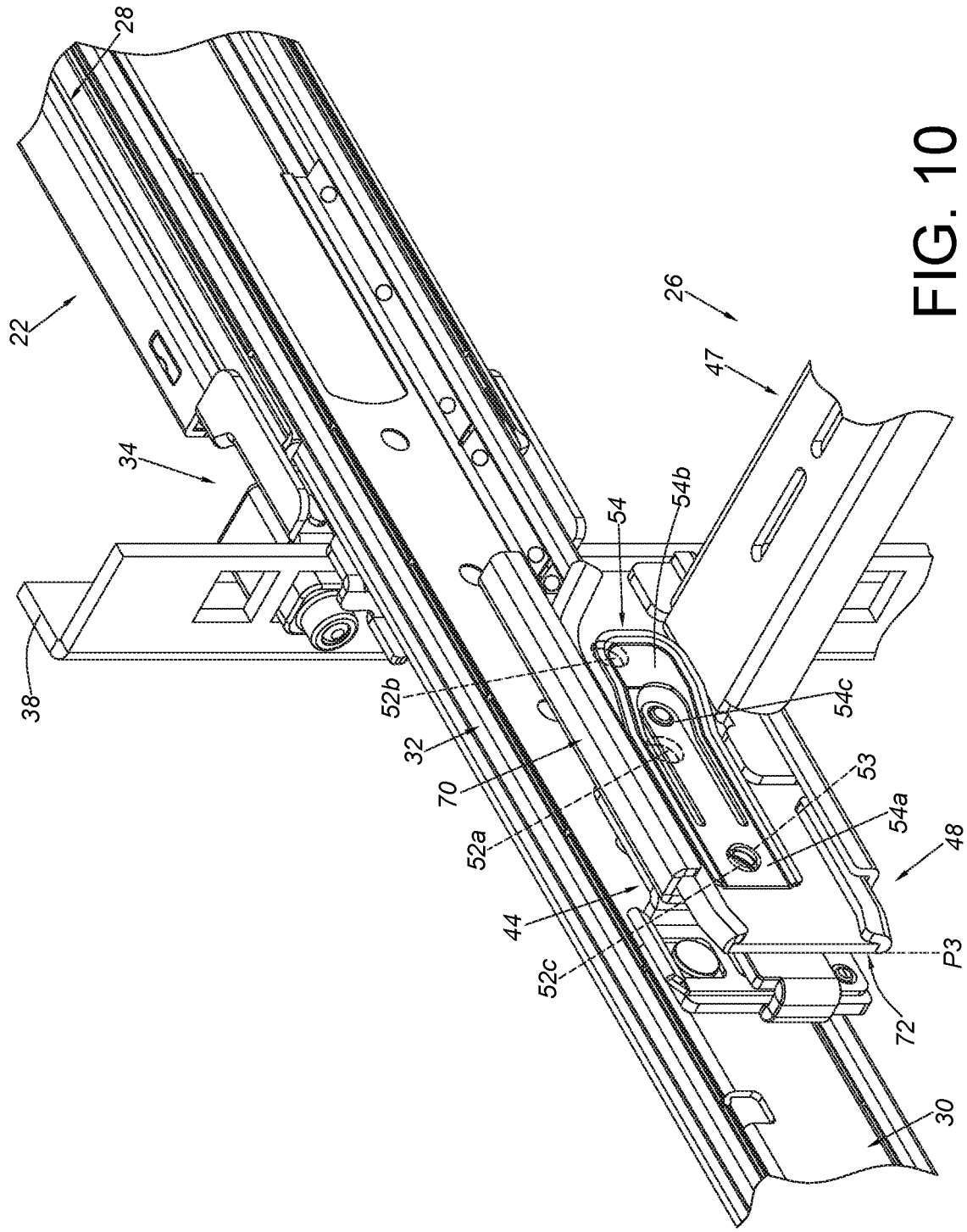
FIG. 10 is a partial view showing the supporting assembly configured to be located at a third connecting position relative to the slide rail assembly through the connecting device being engaged with the mounting device according to an embodiment of the present invention.

As shown in FIG. 8, FIG. 9 and FIG. 10, the supporting assembly 26 can be adjusted to longitudinally move relative to the first mounting device 44 (and the second mounting device 46) to a first connecting position P1 (as shown in FIG. 8), a second connecting position P2 (as shown in FIG. 9), or a third connecting position P3 (as shown in FIG. 10).

Specifically, the supporting assembly 26 can be fixed at the first connecting position P1 (as shown in FIG. 8) through the engaging part 54a (such as the positioning member 53 or the protrusion) of the engaging member 54 being engaged with the first engaging feature 52a; or the supporting assembly 26 can be fixed at the second connecting position P2 (as shown in FIG. 9) through the engaging part 54a (such as the positioning member 53 or the protrusion) of the engaging member 54 being engaged with the second engaging feature 52b; or the supporting assembly 26 can be fixed at the third connecting position P3 (as shown in FIG. 10) through the engaging part 54a (such as the positioning member 53 or the protrusion) of the engaging member 54 being engaged with the third engaging feature 52c.

Figure 11:
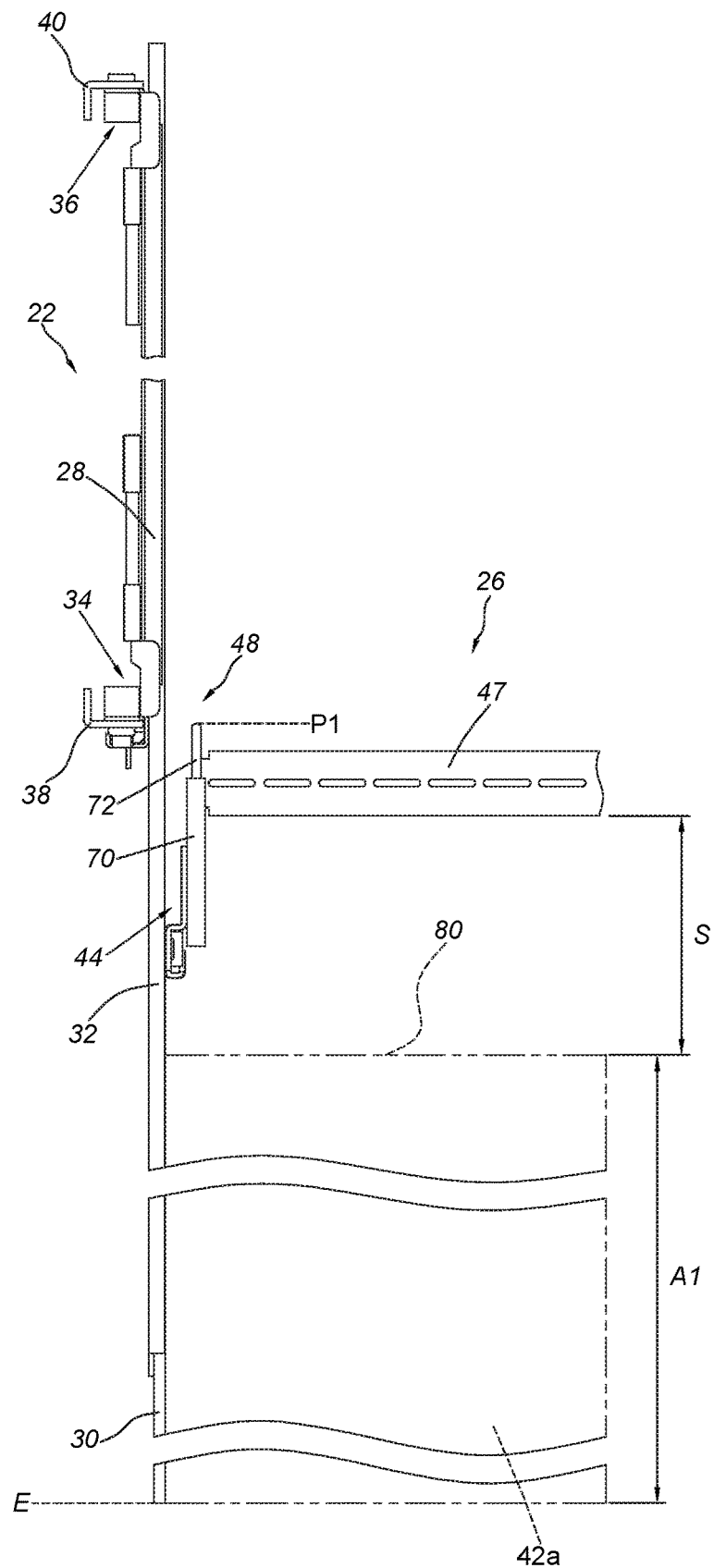
FIG. 11 is a diagram showing the supporting assembly configured to be located at the first connecting position relative to the slide rail assembly through the connecting device being engaged with the mounting device in order to separate the supporting assembly from a first carried object by a predetermined distance according to an embodiment of the present invention.

As shown in FIG. 11, the first rail 28, the second rail 30 and the third rail 32 of each of the two slide rail assemblies 22, 24 are in the extended state E (only the first slide rail assembly 22 is shown in FIG. 11). Specifically, the second rail 30 is configured to carry a first carried object 42a, and the first carried object 42a has a first longitudinal length A1. Since an electronic module is usually arranged on a rear portion 80 of the first carried object 42a, the supporting member 47 of the supporting assembly 26 is configured to keep the predetermined distance S from the rear portion 80 of the first carried object 42a, so as to assist the user in inserting or removing a connector of a cable of the electronic module. For the first carried object 42a having the first longitudinal length A1, the supporting assembly 26 can be adjusted to longitudinally move to the first connecting position P1 to keep the predetermined distance S between the supporting member 47 and the rear portion 80 of the first carried object 42a.

Figure 12:
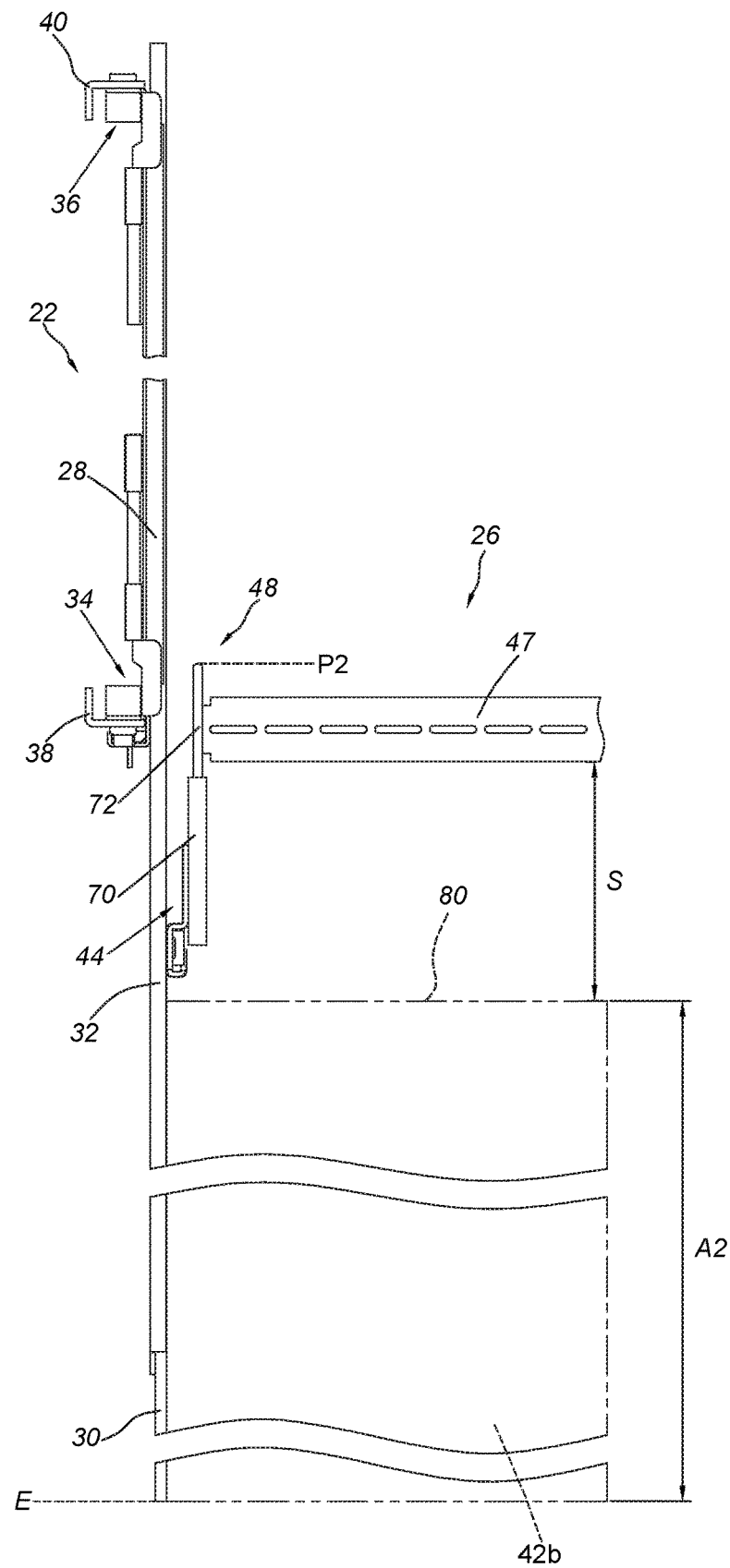
FIG. 12 is a diagram showing the supporting assembly configured to be located at the second connecting position relative to the slide rail assembly through the connecting device being engaged with the mounting device in order to separate the supporting assembly from a second carried object by the predetermined distance according to an embodiment of the present invention.

As shown in FIG. 12, for a second carried object 42b having a second longitudinal length A2, the supporting assembly 26 can be adjusted to longitudinally move to the second connecting position P2 to keep the predetermined distance S between the supporting member 47 and a rear portion 80 of the second carried object 42b.

Figure 13:
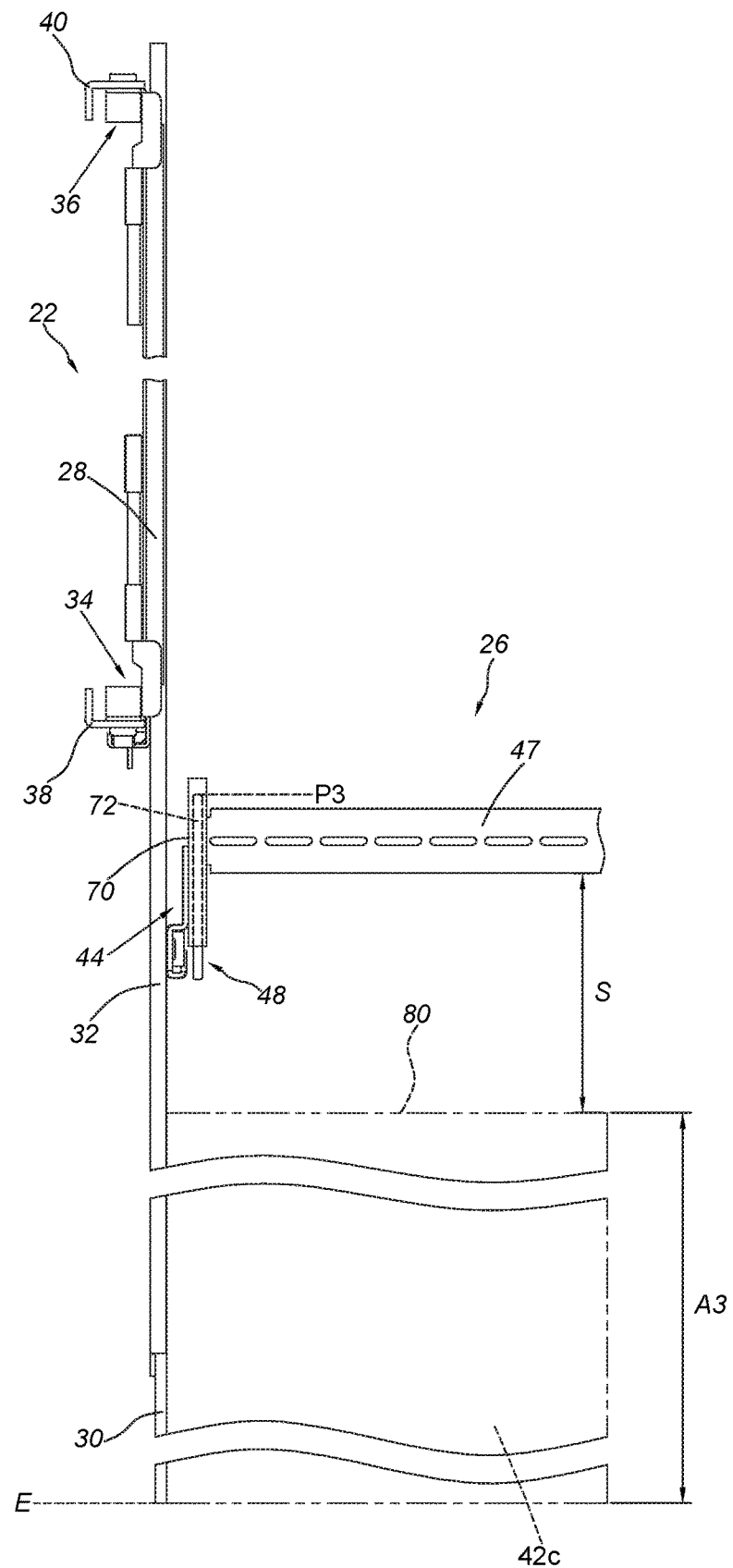
FIG. 13 is a diagram showing the supporting assembly configured to be located at the third connecting position relative to the slide rail assembly through the connecting device being engaged with the mounting device in order to separate the supporting assembly from a third carried object by the predetermined distance according to an embodiment of the present invention.

As shown in FIG. 13, for a third carried object 42c having a third longitudinal length A3, the supporting assembly 26 can be adjusted to longitudinally move to the third connecting position P3 to keep the predetermined distance S between the supporting member 47 and a rear portion 80 of the third carried object 42c.

The supporting assembly 26 (or the supporting member 47 of the supporting assembly 26) can be adjusted to different positions in response to the carried objects with different longitudinal lengths. In other embodiments, the supporting assembly 26 (or the supporting member 47 of the supporting assembly 26) can be adjusted to different positions for adjusting a distance between the rear portion 80 of the carried object 42 and the supporting assembly 26.

Therefore, the slide rail mechanism and the supporting assembly of the present invention are characterized in that:

1. The supporting assembly 26 can be connected (such as detachably connected) to the second rail 30 (such as the inner rail) of the slide rail assembly.

2. The supporting assembly 26 can be longitudinally adjusted relative to the mounting devices 44, 46 to different connecting positions P1, P2, P3.

3. The engaging member 54 can be an elastic piece, and the connecting part 54c of the engaging member 54 can work as a supporting point. Therefore, the user only needs to press the operating part 54b to disengage the engaging part 54a from the at least one engaging feature. Overall, the engaging member 54 having the operating part 54b and the engaging part 54a is configured to be operated to provide engaging and disengaging functions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail mechanism, comprising:
   a first slide rail assembly comprising a first rail, a second rail and a third rail movably mounted between the first rail and the second rail, and the second rail being longitudinally movable relative to the first rail, wherein the second rail of the first slide rail assembly is arranged with a first mounting device;
   a second slide rail assembly comprising a first rail, a second rail and a third rail movably mounted between the first rail and the second rail of the second slide rail assembly, wherein the second rail of the second slide rail assembly is arranged with a second mounting device; and
   a supporting assembly comprising a supporting member, a first connecting device arranged on the supporting member and a second connecting device arranged on the supporting member, wherein the first connecting device and the second connecting device are configured to be detachably connected to the first mounting device and the second mounting device respectively;
   wherein one of the first mounting device and the first connecting device comprises at least one engaging feature, and the other one of the first mounting device and the first connecting device comprises an engaging member configured to be engaged with the at least one engaging feature;
   wherein the at least one engaging feature comprises a first engaging feature, a second engaging feature and a third engaging feature, and the engaging member comprises an engaging part configured to be selectively engaged with one of the first engaging feature, the second engaging feature and the third engaging feature;
   wherein the slide rail mechanism further comprises a connecting base; wherein the engaging member further comprises an operating part and a connecting part, the connecting part is located between the operating part and the engaging part, and the connecting part is connected to the connecting base.

2. The slide rail mechanism of claim 1, wherein the supporting member is substantially transversally arranged relative to a longitudinal direction of each of the first and second slide rail assemblies, and the first connecting device and the second connecting device are respectively arranged adjacent to end parts of two portions of the supporting member.

3. The slide rail mechanism of claim 1, wherein the first engaging feature, the second engaging feature and the third engaging feature are spaced from each other along a longitudinal direction of each of the first and second slide rail assemblies.

4. The slide rail mechanism of claim 1, wherein the supporting member has a front part, a rear part and a middle part located between the front part and the rear part, and the front part and the rear part are substantially perpendicularly connected to the middle part.

5. The slide rail mechanism of claim 1, wherein the connecting part is fixedly connected to the connecting base, the operating part is extended from the engaging part, and the operating part is tilted relative to the engaging part with the connecting part working as a supporting point; wherein when the operating part is pressed, the engaging part is configured to be disengaged from one of the first engaging feature, the second engaging feature and the third engaging feature.

6. The slide rail mechanism of claim 5, wherein the connecting base has a hole, and the engaging part of the engaging member is located at a position corresponding to the hole.

7. The slide rail mechanism of claim 1, further comprising a mounting base, wherein the mounting base comprises the at least one engaging feature, and the connecting base is movably mounted to the mounting base through a guiding passage.

8. The slide rail mechanism of claim 7, wherein one of the mounting base and the connecting base comprises a first bending wall, a second bending wall and a side wall connected between the first bending wall and the second bending wall, and the guiding passage is defined by the first bending wall, the second bending wall and the side wall.

9. A supporting system comprising:
a first mounting device;
a second mounting device; and
a supporting assembly comprising:
  a supporting member having a first portion and a second portion opposite to each other;
  a first connecting device arranged adjacent to the first portion and configured to be engaged with the first mounting device; and
  a second connecting device arranged adjacent to the second portion and configured to be engaged with the second mounting device;
wherein one of the first mounting device and the first connecting device comprises at least one engaging feature, the other one of the first mounting device and the first connecting device comprises an engaging member, and the engaging member comprises an engaging part configured to be engaged with the at least one engaging feature;
wherein the supporting assembly further comprises a connecting base; wherein the engaging member further comprises an operating part and a connecting part, the connecting part is located between the operating part and the engaging part, and the connecting part is connected to the connecting base;
wherein the connecting part is fixedly connected to the connecting base, the operating part is extended from the engaging part, and the operating part is tilted relative to the engaging part with the connecting part working as a supporting point; wherein when the operating part is pressed, the engaging part is configured to be disengaged from one of the at least one engaging feature;
wherein the supporting assembly further comprises a mounting base, wherein the mounting base comprises the at least one engaging feature, and the connecting base is movably mounted to the mounting base through a guiding passage.

10. The supporting system of claim 9, wherein the supporting member has a front part, a rear part and a middle part located between the front part and the rear part, and the middle part is arranged with at least one cable management feature.

11. The supporting system of claim 9, wherein the connecting base has a hole, and the engaging part of the engaging member is located at a position corresponding to the hole.

12. The supporting system of claim 9, wherein one of the mounting base and the connecting base comprises a first bending wall, a second bending wall and a side wall connected between the first bending wall and the second bending wall, and the guiding passage is defined by the first bending wall, the second bending wall and the side wall.

* * * * *